May 9, 1967 T. D. McCALL 3,319,184

OSCILLATOR WITH D.-C. BACK-BIASED ZENER DIODE TO STABILIZE AMPLITUDE

Filed Jan. 19, 1965

INVENTOR.
THOMAS D. McCALL

BY Harry M. Saragovitz, Edward J. Kelly, Herbert Berl & Charles L. Whitham
ATTORNEYS United States Patent Office 3,319,184
Patented May 9, 1967

3,319,184

OSCILLATOR WITH D.-C. BACK-BIASED ZENER DIODE TO STABILIZE AMPLITUDE

Thomas D. McCall, Rockville, Md., assignor to the United States of America as represented by the Secretary of the Army Filed Jan. 19, 1965, Ser. No. 426,699
6 Claims. (Cl. 331—109)

ABSTRACT OF THE DISCLOSURE

This disclosure describes a transistorized Wien bridge R-C oscillator with the degenerative feedback being provided by a resistive divider in series with a Zener diode. The Zener diode is connected to the output of the oscillator and is back-biased into the Zener region so that its impedance varies inversely with the current through it, varying the gain of the oscillator inversely with variations in the A.C. output of the oscillator thereby stabilizing the oscillator output.

Greater output amplitude sensitivity is obtained by rectifying a portion of the oscillator output and applying this D.C. voltage to the oscillator input. A starting circuit is provided consisting of a resistive voltage divider connected across the B+ supply having a diode connecting the voltage divider to the oscillator input. When the oscillator is functioning, the diode is rendered non-conducting thereby turning off the starting circuit.

The invention described herein may be manufactured and used by or for the Government of the United States of America for governmental purposes without the payment to me of any royalty thereon.

This invention relates generally to transistor R-C oscillators, and more particularly to an amplitude stable, resistance-capacitance tuned Wien bridge transistor oscillator.

There is a wide range of uses for resistance-capacitance tuned oscillators at audio and the lower radio frequencies. These include applications as test oscillators and standard frequency signal generators. Such applications require a high degree of amplitude and frequency stability with a minimum of distortion to the output signal, and this often without the benefit of a regulated power supply and under the condition of varying ambient temperature. When used as a standard frequency signal generator in ordnance and other military applications, a low frequency oscillator must also be inexpensive, compact and rugged.

The classical method of providing amplitude stabilization in a resistance-capacitance tuned oscillator is to connect a tungsten filament lamp in a degenerative feedback loop of the oscillator circuit. The lamp is so connected that as the amplitude of the output signal of the oscillator increases the current through the lamp increases. The increased current through the lamp causes the lamp filament to heat thereby increasing its resistance. As the resistance of the lamp filament increases the gain of the degenerative feedback loop increases resulting in a decrease in the amplitude of the output signal of the oscillator. While this technique has been entirely satisfactory in laboratory environments, it is not suitable for military applications for several reasons. First, the filament of the lamp is too fragile to withstand the severe vibration and shock to which the oscillator is often subjected. Second, the resistance of the lamp filament is temperature dependent which means that the gain of the degenerative feedback loop varies not only with the amplitude of the output signal of the oscillator but also with the ambient temperature. Third, the power drawn by the lamp is too great for long battery life which is often a critical consideration in military applications. Fourth, oscillators using lamps for amplitude stability often require large electrolytic capacitors in series with the feedback loop as D.-C. blocking elements. This results in a very bulky structure. In order to overcome some of the disadvantages associated with the tungsten filament lamp it has been proposed that a thermistor be used as the variable impedance unit in the degenerative feedback loop of the oscillator; however, thermistors, like the lamp, are temperature dependent. Furthermore, thermistors are typically very non-linear devices and as a result tend to introduce or cause considerable distortion in the output signal at the amplifier. Diodes have also been used to limit the amplitude of oscillators; but if the amplitude of the output voltage of an oscillator is determined solely by limiting, the distortion is unacceptably large. Diode networks have been constructed which, when controlled by a feedback voltage, act as a variable impedance in the degenerative feedback loop. When such diode networks are used, it is usually necessary to derive the controlling feedback voltage from a comparator network which compares the output voltage of the oscillator with a standard or reference voltage. The reference voltage may be provided by a battery or established by a Zener diode. Obviously, this technique results in a rather complex and bulky circuit which is prohibitively expensive to construct in large numbers.

It is therefore an object of this invention to provide a simple resistance-capacitance tuned oscillator with good frequency and amplitude stability which is relatively unaffected by temperature variations.

It is another object of the instant invention to provide an amplitude stable low-frequency oscillator that produces an output signal that has low harmonic content.

It is a further object of this invention to provide an R-C oscillator which is extremely rugged and compact and is simple and economical to construct.

According to the present invention, the foregoing and other objects are attained by providing a transistor Wien bridge R-C oscillator having a Zener diode connected as a current-dependent impedance in the degenerative feedback loop of the oscillator.

The specific nature of the invention as well as other objects, aspects, uses and advantages thereof, will clearly appear from the following description and from the accompanying drawing in which.

Figures 1, 2, 3:
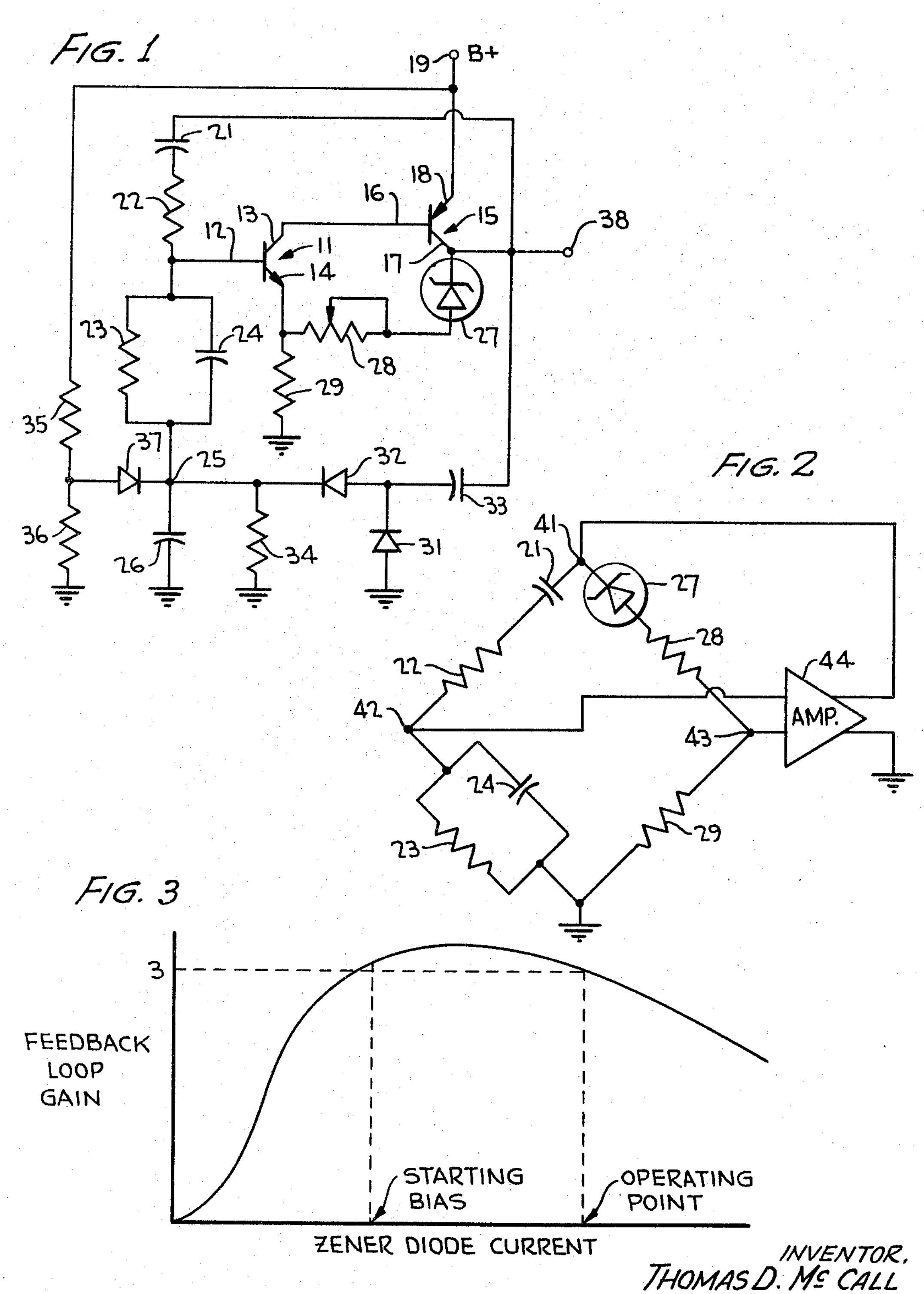
FIGURE 1 is a schematic diagram of a specific embodiment of the invention.
FIGURE 2 is a simplified schematic diagram useful in explaining the operation of the circuit shown in FIGURE 1.
FIGURE 3 is a graph of the gain of the regenerative feedback loop versus the current through the Zener diode in the feedback loop.

Referring now to the drawing, and more particularly to FIGURE 1, an oscillator according to this invention is shown as comprising an NPN transistor 11 having a base electrode 12, a collector electrode 13, and an emitter electrode 14, and further comprising a PNP transistor 15 having a base electrode 16, a collector electrode 17, and an emitter electrode 18. The collector 13 of NPN transistor 11 is directly connected to the base 16 of PNP transistor 15, while the emitter 18 of PNP transistor 15 is connected to a source of positive voltage at terminal 19. Thus connected, NPN transistor 11 and PNP transistor 15 constitute a complementary pair two stage amplifier with a current gain approximately equal to the product of the betas of both transistors. The collector 17 of PNP transistor 15 is connected by way of series connected capacitor 21 and resistor 22 to the base 12 of NPN transistor 11. The base 12 of NPN transistor 11 is also connected by way of parallel connected resistor 23 and capacitor 24 to junction 25. Junction 25 is connected by way of capacitor 26, the function of which will be explained in some detail later, to ground. The series connected capacitor 21 and resistor 22 and the parallel connected resistor 23 and capacitor 24, therefore, constitute a resistance-capacitance voltage divider connected across the output of the two stage amplifier at the collector 17 of PNP transistor 15 and ground. A regenerative feedback voltage developed by the voltage divider at the junction of the series connected capacitor 21 and resistor 22 with the parallel connected resistor 23 and capacitor 24 is applied to the base 12 of NPN transistor 11. The oscillator will oscillate at a frequency such that the voltage applied across the base 12 of NPN transistor 11 and ground has the same phase as the voltage developed across the collector 17 of PNP transistor 15 and ground. This occurs when the phase angles of the resistance 22-capacitance 21 and the resistance 23-capacitance 24 are the same. For the case where the resistance 22 equals the resistance 23 and the capacitance 21 equal the capacitance 24, the oscillator frequency is equal to $$\frac{1}{2\pi RC}$$

The collector 17 is also connected by way of Zener diode 27 and potentiometer 28 to the emitter 14 of NPN transistor 11. The potentiometer 28 is connected as a variable resistance, the wiper being shorted to one end of the potentiometer winding. The emitter 14 of NPN transistor 11 is additionally connected by way of resistor 29 to ground. Thus connected, the Zener diode 27, potentiometer 28 and resistor 29 constitute a second voltage divider connected across the collector 17 of PNP transistor 15 and ground. This voltage divider develops a degenerative feedback voltage at the junction of potentiometer 28 and resistor 29 which is applied to the emitter 14 of NPN transistor 11. The Zener diode 27 is a low voltage type and has its cathode connected to the collector 17 of PNP transistor 15 and its anode connected to potentiometer 28. Connected in this manner, the Zener diode 27 is back-biased just into the Zener region such that its impedance varies inversely with the current through it. Thus, an increase in current through Zener diode 27 will decrease its dynamic impedance and thereby increase the degenerative voltage feedback which causes the gain of the two-stage amplifier to decrease. Since the gain of the two-stage amplifier is high, a small bias current into the base 12 of NPN transistor 11 will greatly increase the current through PNP transistor 15 and also through Zener diode 27 resulting in great output amplitude sensitivity. In order to provide the bias current to the base 12 of NPN transistor 11, a rectifier circuit comprising diodes 31 and 32 is provided. The cathode of diode 31 is connected to the anode of diode 32, and the anode of diode 31 is connected to ground. The collector 17 of PNP transistor 15 is connected by way of D.C. blocking capacitor 33 to the junction of the cathode of diode 31 and the anode of diode 32. The cathode of diode 32 is connected to junction 25. The positive half cycles of the output signal appearing at the collector 17 of PNP transistor 15 are, therefore, applied across capacitor 26 which becomes charged. A resistor 34 is connected across capacitor 26 and provides a discharge path. The time constant of resistance 34-capacitance 26 is made much greater than one period of oscillation of the oscillator. A starting circuit may be necessary since the regenerative feedback loop gain may not be enough to start oscillations when power is first applied. A fixed biasing resistor connected to the base 12 of NPN transistor 11 can be used, but there is danger of excess bias current which will tend to add to the bias current from the rectifier circuit and cause oscillations to cease. A preferred starting circuit is shown and comprises a voltage divider connected across the source of positive voltage at terminal 19 and ground. The voltage divider is composed of series connected resistors 35 and 36. The junction of resistors 35 and 36 is connected to the anode of diode 37. The cathode of diode 37 is connected to junction 25. When power is applied to the circuit, capacitor 26 is initially charged through diode 37 thereby providing the required bias to start oscillations. Diode 37 stops conducting and the starting circuit is no longer effective when the voltage across capacitor 26 exceeds the voltage at the anode of diode 37 developed by the voltage divider. This occurs within a very few cycles of oscillation due to the charging of capacitor 26 by the rectifier circuit comprising diodes 31 and 32. The output from the oscillator is taken at terminal 38 which is connected to the collector 17 of PNP transistor 15.

FIGURE 2 of the drawing shows a simplified schematic diagram of the oscillator circuit shown in FIGURE 1. Series connected capacitor 21 and resistor 22 are connected between junctions 41 and 42. Parallel connected resistor 23 and capacitor 24 are connected between junction 42 and ground. Zener diode 27 and potentiometer 28 (represented as a fixed resistor) are connected between junction 41 and junction 43. Resistor 29 is connected between junction 43 and ground. The two stage amplifier comprising the complementary pair transistors 11 and 15 is represented by the amplifier 44. The input terminals of amplifier 44 are connected to junctions 42 and 43, while the output terminals of amplifier 44 are connected to junction 41 and ground. Illustrated in this manner it is apparent that the regenerative and degenerative feedback networks of the circuit shown in FIGURE 1 are equivalent to a Wein bridge with the amplifier output applied across one pair of diagonally opposite corners of the bridge and the amplifier input obtained from the other diagonally opposite corners. The regenerative coupling between the amplifier output and the amplifier input can be regarded as arising from bridge unbalance.

FIGURE 3 of the drawing shows graphically the gain of the degenerative feedback loop containing the Zener diode 27 in FIGURE 1 as a function of the current through the Zener diode 27. It is known that the loop gain of a Wien bridge oscillator with equal values of resistors 22 and 23 and capacitors 21 and 24 should be slightly greater than 3. The dynamic impedance of Zener diode 27 should, therefore, be kept adjusted to a value to give a loop gain of greater than 3 as illustrated in FIGURE 3.

In operation, the potentiometer 28 is adjusted to give the best wave shape. There is distortion in the sine wave output since the Zener diode 27 is a nonlinear element. This distortion is due primarily to the A.C. signal current through the Zener diode 27. Since the D.C. current through the Zener diode 27 due to the biasing network comprising rectifier diodes 31 and 32 is large with respect to the A.C. current, the distortion is quite small. The linearity of the gain curve in FIGURE 3 in the vicinity of the operating point is an indication of the lack of distortion in the oscillator output signal. The distortion that exists is due mostly to second harmonic, there being no higher order harmonics as would be present if the amplitude stabilizing device was a clipping or limiting one.

It will be apparent that the embodiment shown is only exemplary and that various modifications can be made in construction and arrangement within the scope of the invention as defined in the appended claims.

I claim as my invention:

1. In a resistance-capacitance tuned transistor oscillator having:

(a) a transistor amplifier, and (b) a regenerative feedback network connected between the output and an input of said amplifier, said regenerative feedback network including a plurality of resistors and capacitors the values of which determine the frequency of oscillation of said oscillator, improved means for stabilizing the amplitude of oscillation of said oscillator, comprising:

(c) a resistive degenerative feedback path between the output and an input of said amplifier, (d) a low voltage Zener diode connected in series with said resistive degenerative feedback path, said Zener diode being connected to the output of said amplifier in such a manner that said Zener diode is back-biased to have an operating point within the Zener region whereby the dynamic impedance of said Zener diode will vary inversely with the current through it thereby allowing the gain of said amplifier to vary inversely with variations in the A.C. output of said oscillator, and (e) means connected to the output and an input of said amplifier for rectifying a portion of the output of said oscillator and applying a rectified voltage to said input of said amplifier.

2. The invention according to claim 1 wherein said amplifier serves as a means for amplifying said rectified voltage.

3. The invention according to claim 2 wherein said transistor amplifier consists of a first stage having a first transistor and a second stage having a second transistor.

4. The invention according to claim 3 wherein:

(a) said oscillator includes a circuit ground, (b) said first transistor is an NPN transistor having a base, a collector, and an emitter, (c) said second transistor is a PNP transistor having a base, a collector, and an emitter, (d) said collector of said first transistor is connected to said base of said second transistor, (e) said emitter of said first transistor is connected through a first resistor to circuit ground, (f) said Zener diode and a second resistor are connected in series between said collector of said second transistor and said emitter of said first transistor, (g) a third resistor and a first capacitor are connected in series between said collector of said second transistor and said base of said first transistor, (h) a fourth resistor and a second capacitor are connected in parallel between said base of said first transistor and one terminal of a filter capacitor, the other terminal of said filter capacitor being connected to circuit ground, (i) said emitter of said second transistor is connected to a positive D.-C. power source, and (j) said means for rectifying is connected to develop said rectified voltage across said filter capacitor.

5. The invention according to claim 4 wherein said means for rectifying comprises a third capacitor, a first diode, a second diode, and a fifth resistor, said third capacitor connected between said collector of said second transistor and the cathode of said first diode, the anode of said first diode connected to circuit ground, the anode of said second diode connected to said cathode of said first diode and the cathode of said second diode connected to said one terminal of said filter capacitor, said fifth resistor connected across said filter capacitor.

6. The invention according to claim 5 comprising additionally a starting circuit consisting of: sixth and seventh resistors connected in series between said positive D.-C. power source and circuit ground, and a third diode having its anode connected to the junction of said sixth and seventh resistors and having its cathode connected to said one side of said filter capacitor.

References Cited by the Examiner

UNITED STATES PATENTS

| | | | |
|---|---|---|---|
| 3,144,619 | 8/1964 | Cochran | 331—141 X |
| 3,212,026 | 10/1965 | Julie | 331—141 |

FOREIGN PATENTS 829,086 2/1960 Great Britain.

OTHER REFERENCES

Levitt, A Reflex Wien-Bridge Oscillator With Analysis, Journal of the Audio Engineering Society, October 1963, vol. II, No. 4, pp. 329–339 (page 329 relied on).

Electronics, Oscillator Delivers Clean Sine Waves, August 1962, page 62.

The C–D Capacitor, vol. 25, No. 3, May–June 1960, page 6.

References Cited by the Applicant

UNITED STATES PATENTS

| | | |
|---|---|---|
| 2,970,280 | 1/1961 | Dulberger. |
| 3,060,326 | 10/1962 | Watson. |
| 3,117,288 | 1/1964 | Modiano. |

ROY LAKE, *Primary Examiner.*

J. B. MULLINS, *Assistant Examiner.*